United States Patent [19]

Fukuoka

[11] Patent Number: 5,153,709
[45] Date of Patent: Oct. 6, 1992

[54] ELECTRONIC APPARATUS

[75] Inventor: Yoshitaka Fukuoka, Kawasaki, Japan

[73] Assignee: Kabushiki Kaisha Toshiba, Kanagawa, Japan

[21] Appl. No.: 817,996

[22] Filed: Jan. 9, 1992

Related U.S. Application Data

[63] Continuation of Ser. No. 622,111, Oct. 30, 1990, which is a continuation of Ser. No. 358,500, May 30, 1989, which is a continuation of Ser. No. 111,682, Oct. 22, 1987, abandoned.

[30] Foreign Application Priority Data

Oct. 29, 1986 [JP] Japan .................. 61-257971
Oct. 30, 1986 [JP] Japan .................. 61-259164
Oct. 30, 1986 [JP] Japan .................. 61-259168

[51] Int. Cl.$^5$ .................. H01L 23/48; H01L 39/02
[52] U.S. Cl. .................. 357/71; 357/75; 357/80
[58] Field of Search .................. 357/74, 80, 75, 71

[56] References Cited

U.S. PATENT DOCUMENTS

| | | | |
|---|---|---|---|
| 3,469,148 | 9/1969 | Lund .................. | 357/75 |
| 3,793,064 | 2/1974 | Budd et al. .................. | 357/80 |
| 4,340,902 | 7/1982 | Honda et al. .................. | 357/80 |
| 4,417,392 | 11/1983 | Ibrahim et al. .................. | 357/80 |
| 4,558,171 | 12/1985 | Gantley et al. .................. | 174/52.4 |
| 4,560,826 | 12/1985 | Burns et al. .................. | 174/52.4 |
| 4,656,499 | 4/1987 | Butt .................. | 357/74 |
| 4,663,649 | 5/1987 | Suzuki et al. .................. | 357/74 |

FOREIGN PATENT DOCUMENTS

| | | |
|---|---|---|
| 0092944 | 11/1983 | European Pat. Off. . |
| 0113282 | 7/1984 | European Pat. Off. . |
| 3304215 | 7/1984 | Fed. Rep. of Germany . |
| 23531 | 2/1984 | Japan .................. 357/75 |

OTHER PUBLICATIONS

IEEE Proceedings of the 31st Electronic Components Conference, May 1981, pp. 9-17.

*Primary Examiner*—Eugene R. LaRoche
*Assistant Examiner*—Michael B. Shingleton
*Attorney, Agent, or Firm*—Finnegan, Henderson, Farabow, Garrett and Dunner

[57] ABSTRACT

Disclosed electronic apparatus comprises a ceramic substrate, a multilayered wiring portion disposed at a distance from the periphery of the main surface of the ceramic substrate and produced by alternately repeating a conductor pattern formed by the thin-film method using a conductive metal and a polyimide layer, electronic devices mounted on the multilayered wiring portion and electrically connected to the conductor patterns of the multilayered wiring portion, input and output conductor pads formed on the periphery of the main surface of the ceramic substrate, connection conductor patterns formed on the main surface of the ceramic substrate astride the gap between the line patterns of the multilayered wiring portion and the input and output conductor pads, an inorganic insulation layer formed annularly on the main surface of the ceramic substrate across over at least part of the connection conductor patterns around the multilayered wiring portion, a metallized layer formed on the inorganic insulation layer, and a moistureproof cap having the edge thereof hermetically fixed by soldering on the metallized layer. Since the metallic cap can be fixed heremetically to the annular metallized layer and moreover since the inorganic insulation layer outside the seal ring patterns is formed of a ceramic material, this electronic apparatus produces a highly reliable operation without entailing the dangers of closed-circuit failure, corrosion, and formation of dew.

11 Claims, 4 Drawing Sheets

ELECTRONIC APPARATUS

This application is a continuation of application Ser. No. 07/622,111, filed Oct. 30, 1990, now abandoned, which is a continuation of application Ser. No. 07/358,500, filed May 30, 1989, now abandoned, which is a continuation of application Ser. No. 07/111,682, filed Oct. 22, 1987, now abandoned.

The present application claims priority of Japanese Patent Application No. 61-257971 filed on Oct. 29, 1987, No. 61-259164 and No. 61-259168 filed on Oct. 30, 1987, respectively.

FIELD OF THE INVENTION AND RELATED ART STATEMENT

This invention relates to an electronic apparatus and more particularly to an electronic apparatus of the type which, like a hybrid IC, has electronic devices mounted on a multilayer substrate and covered with a hermetic cap.

The desirability of the trend of electronic apparatus toward decrease of size and weight, diversification of function, increase of operational speed, and improvement of operational reliability has been finding growing recognition. In reply to this demand, hybrid IC's constructed by mounting numerous chip components such as IC chips, resistors, and capacitors on a multilayer ceramic substrate and hermetically covering these chip components with a metallic cap are finding increasing applications.

The ceramic multilayer substrates which are used for such hybrid IC's have been heretofore produced by the green sheet method, the thick film method, or the mixed thick film-thin film method.

In the ceramic multilayer substrates, since the insulation layers are formed of such materials of relatively large dielectric constants ($\epsilon$) as ceramic ($\epsilon = 8$ to 10) and crystallized glass ($\epsilon = 9$ to 20), it is difficult to keep the floating capacity for wiring line patterns down to a low level. This difficulty has formed the cause for the retardation in the improvement of operational speed of the component devices mounted on the substrates.

Recently, a copper-polyimide multilayer substrate has been developed for supporting high-speed devices. This multilayer substrate has a construction in which, as illustrated in FIG. 1, a thin-film conductor pattern 1 formed mainly of copper in a thickness of about 1 to 10 $\mu$m, generally 1 to 3 $\mu$m and a polyimide layer 2 having the thickness of about 10 $\mu$m are alternately superposed a plurality of times on a ceramic substrate 3. It is produced as follows.

First, the thin-film conductor pattern is formed by evaporating or sputtering a conductive metal composed of copper as a main component and other additional metal superposing a conductor layer on the entire surface of the ceramic substrate 3 and etching unnecessary portions by the photolithographic technique. Then, on this thin-film conductor pattern, polyimide is deposited in the form of a thin layer by spin coating and this thin layer is dried. By photolithography, via holes 4 are formed to interconnect the upper and lower conductor patterns 1 electrically. By repeating this procedure a plurality of times, there is obtained a copper-polyimide multilayer substrate.

This copper-polyimide mutilayer substrate permits the devices mounted thereon to operate at high speeds because the polyimide resin of which the insulation layers are made has an extremely small dielectric constant ($\epsilon = 3$ to 4) and further because the conductor patterns 1 are formed of a smaller conductive electric resistance than other metals.

This copper-polyimide multilayer substrate, however, has a disadvantage that the polyimide resin used therein is hygroscopic. The hybrid IC which is produced by mounting IC chips on this substrate and hermetically sealing the IC chips with a metallic cap, therefore, suffers moisture to permeate through the polyimide layer 2 and reach the interior of the metallic cap.

Thus, the conventional hybrid IC's using this copper-polyimide multilayer substrate have had the disadvantage that the humidity reaching the interior of the metallic cap through the polyimide layer 2 will expose the multilayered wiring portion to the danger of forming closed-circuit failure through migration, the IC chips and bonding wires to the danger of yielding to corrosion, and the entire IC proper to the danger of establishing closed-circuit failure due to formation of dew during the course of the temperature cycling test.

OBJECT AND SUMMARY OF THE INVENTION

A primary object of this invention, therefore, is to provide an electronic apparatus constructed that the IC chips mounted on the substrate thereof will operate at high speeds, the portion hermetically sealed with a cap will not admit moisture, and the danger of migration, the danger of wire corrosion, the danger of dew formation, and the danger of establishment of closed-circuit failure due to formation of dew during the course of temperature cycling test will never happen.

Another object of this invention is to provide an electronic apparatus incorporating therein an input-output conductor pad which enables a metallic cap, input and output leads, and input and output pins to be fixed thereto with full strength.

The electronic apparatus of this invention comprises a ceramic substrate, a multilayered wiring portion disposed at a distance from the periphery of the main surface of the ceramic substrate and produced by alternately repeating a conductor pattern formed by the thin-film method using a conductive metal and a polyimide layer, electronic devices mounted on the multilayered wiring portion and electrically connected to the conductor patterns of the multilayered wiring portion, input and output conductor pads formed on the periphery of the main surface of the ceramic substrate, connection conductor patterns formed on the main surface of the ceramic substrate astride the gap between the line patterns of the multilayered wiring portion and the input and output conductor pads, an inorganic insulation layer formed annularly on the main surface of the ceramic substrate across over at least part of the connection conductor patterns around the multilayered wiring portion, a metallized layer formed on the inorganic insulation layer, and a moistureproof cap having the edge thereof hermetically fixed by soldering on the metallized layer.

As the ceramic substrate mentioned above, there can be used an alumina substrate or an AlN substrate, for example.

The conductor pattern as the first layer in the multilayered wiring portion is formed, for example, by forming a conductive metal coat on the entire surface of a ceramic substrate by the thin-film method, i.e. by evaporating or sputtering a conductive metal such as Cr/Cu, Ti/Cu, Cr/Cu/Cr, Ti/Cu/Ti, Cr/Cu/Au, or Ti/-

Cu/Au which has copper as a main component and etching the conductive metal coat in a prescribed pattern by the photolithographic method. The conductor pattern as the lowermost layer is formed in such a manner that the edges thereof will be superposed on the inner edges of the connection conductor patterns which will be described more fully later on and is electrically connected to the connection conductor patterns. The polyimide layer superposed on the thin-film conductor pattern is formed, for example, by applying a photosensitive polyimide resin in the form of a thin film by spin coating on the aforementioned conductor pattern, drying the applied film of the polyimide resin, and etching the dry film photolithographically in such a manner as to impart via holes and a visible contour thereto.

The multilayered wiring portion is formed by alternately repeating the aforementioned thin-film conductor pattern and polyimide layer a plurality of times.

The input and output conductor pads and the connection conductor patterns are generally formed by superposing a pasty conductive composition on the ceramic substrate by the thick-film method, i.e. by printing the pasty conductive composition in prescribed patterns by the screen printing method and drying and firing the deposited layers of the composition. As examples of the pasty conductive composition suitably used by the thick-film method, there may be cited Cu paste, Ag-Pt paste, Au-Pt paste, and Ag-Pd paste which exhibit satisfactory wettability and low diffusibility to the Sn-Pb type solder. Suitably, the thickness which the input and output conductor pads and the connection conductor patterns will assume after the firing are approximately in the range of 1 to 20 $\mu$m.

The thick-film method described herein, has generally two process as follows.

In the first process, a photosensitive layer is formed by applying a photosensitive emulsion on a screen having generally 325 mesh and drying the screen. Then this photosensitive layer is exposed by using a mask and developed. Thereby, this layer is partially removed. Setting the obtained screen on the substrate and printing by using a pasty conductive composition, this pasty composition is printed on the screen only to the part which the photosensitive layer is partially removed. This process can be used for forming a conductor pattern generally having the line width of about 100 $\mu$m or more and the thickness in the range of 10 to 15 $\mu$m.

In the second process, the pasty conductive composition is printed on the substrate in the thin layer state by using the screen having generally 400 mesh. This layer of pasty conductive composition is dried and fired, thereby causing a uniform conductor layer. Then this conductor layer is etched by the photolithographic technique. Thereby, the prescribed conductor pattern can be obtained. This process can be used for forming a fine conductor pattern generally having the line width in the range of 30 to 50 $\mu$m and the thickness in the range of 3 to 5 $\mu$m.

Optionally, the input and output conductor pads may be formed in combination with the conductor pattern as the uppermost layer of the multilayered wiring portion, subsequently to the formation of the connecting conductor patterns by the thick-film method, in accordance with the thin-film method applying the aforementioned conductive metal composed mainly of copper in such a manner as to overlie the outer edges of the connection conductor patterns. The input and output conductor pads may be otherwise obtained by first forming the conductor metal in a prescribed shape by the thick-film method using an Au paste in such a manner as to come into contact with the outer edges of the connection conductor patterns and then coating the deposited layer of the conductor metal with a metal layer formed mainly of copper by the thin-film method.

As the annular inorganic insulation layer to be formed across the connection conductor patterns, it is suitable to use what is produced in a thickness in the range of 10 to 40 $\mu$m by the so-called thick-film method which comprises applying an inorganic insulator paste such as crystallized glass or ceramic in a prescribed pattern on a surface by screen printing and then firing the applied layer.

The annular metallized layer to be formed on the inorganic insulation layer is destined to function as a seal ring pattern while a hermetic cap such as the metallic cap disposed to enclose such devices as IC chips mounted on the multilayered wiring portion is fixed by fusion with a solder. It is superposed on the inorganic insulation layer by the thick-film method using either the aforementioned pasty conductive composition or a pasty conductive composition containing metal powder, metal oxide, etc. Where the annular metallized layer and the input and output conductor pads are formed by the thick-film method specifically using a pasty conductive composition which exhibits satisfactory wettability to the Sn-Pb type solder and diffuses at a low speed in this solder, there is derived the advantage that the layer and the pads so produced will increase the strength of fixation and facilitate the work of soldering when the metallic cap, input and output leads, or input and output pins are to be fixed thereon as with a solder.

Optionally on the entire surfaces of the input and output conductor pads, the connection conductor patterns and the annular metallized layer which have been produced by the thick-film method, the aforementioned conductive metal composed mainly of copper may be applied by the thin-film method so as to coat completely the thick-film layers. The thin-film coats thus added further enhance the strength of fixation and further facilitate the work of soldering when the moistureproof cap, inlet and outlet leads, and input and output pins are to be fixed thereon as with a solder.

The IC chips and the electronic chip components such as resistors and capacitors are mounted on the multilayered wiring portion by a suitable conventional method such as, for example, the wire bonding method or the method of electric connection using bumps and no wire.

On the annular metallized layer, a moistureproof cap such as the metallic cap is hermetically deposited by soldering.

In accordance with the present invention, the metallic cap can be fixed hermetically with the upper side of the annular metallized layer by soldering. Moreover, since the inorganic insulation layer completely outside the seal ring pattern is formed of ceramic or crystallized glass, there is absolutely no possibility of any humidity permeating through the inorganic insulation layer in the direction of thickness. Thus, the electronic apparatus of the present invention is perfectly free from the dangers of closed-circuit failure, corrosion, due to formation of dew and warrants highly reliable performance.

DETAILED DESCRIPTION OF THE PREFERRED EMBODIMENT

Now, the preferred embodiments of the present invention will be described below with reference to the accompanying drawings.

Figure 1:
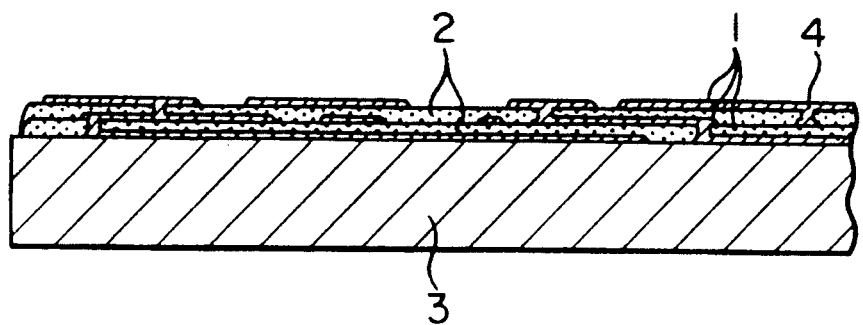
FIG. 1 is a cross section of a conventional copper-polyimide multilayer substrate.
Figure 2:
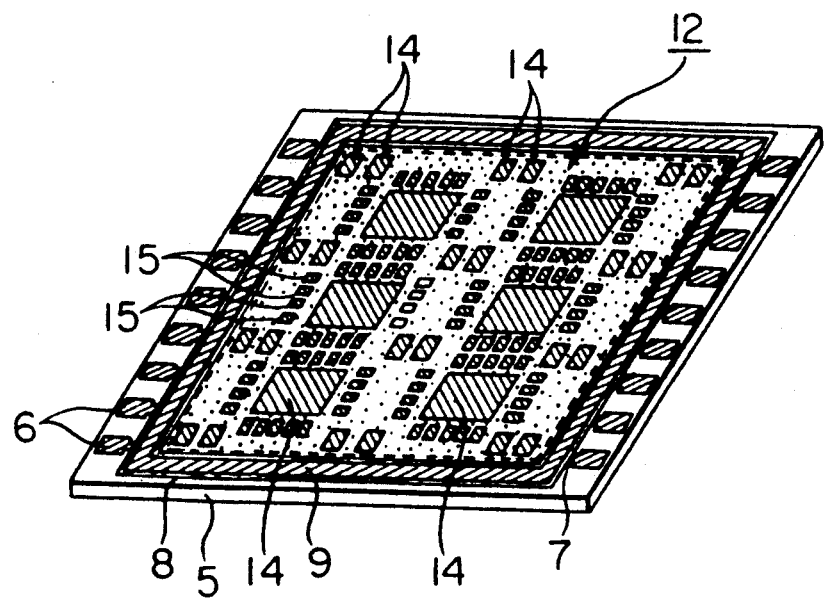
FIG. 2 and FIG. 3 are a perspective view and a partially magnified cross section illustrating a typical multilayer substrate to be used for the electronic apparatus of the present invention.
Figure 3:
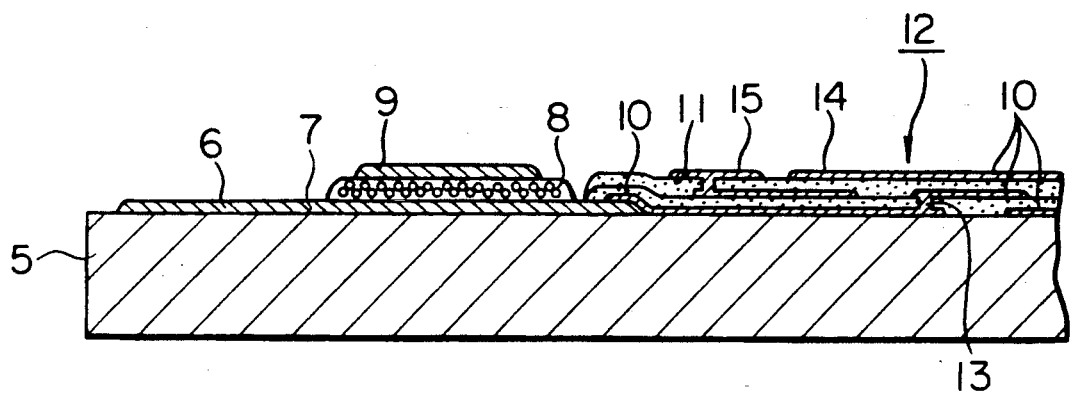

FIG. 2 and FIG. 3 are a perspective view and a partial cross section illustrating a typical multilayer substrate to be used in embodying the present invention.

In these diagrams, the reference numeral 5 denotes a ceramic substrate formed of alumina or AlN, for example. On the peripheral portion of the main surface of this ceramic substrate 5, a plurality of input and output conductor pads 6 and a plurality of relatively short connection conductor patterns 7 extending inwardly from the input and output conductor pads 6 are simultaneously formed in a thickness in the range of 1 to 20 μm by a method which comprises screen printing, drying, and firing and uses a conductive paste such as, for example Cu paste, Ag-Pt paste, Au-Pt paste, or Ag-Pd paste which exhibits satisfactory wettability to the solder and diffuses at a low speed in the solder.

Inside the rows of these input and output conductor pads 6, an annular inorganic insulation layer 8 is deposited across over the connection conductor patterns by a method which comprises screen printing, drying, and firing and uses a crystallized glass paste.

On this annular inorganic insulation layer 8, an annular metallized layer 9 having a slightly smaller width than the inorganic insulation layer 8 is formed by printing the aforementioned conductive paste in such a manner that the underlying inorganic insulation layer will expose on both sides of the metallized layer, and drying and firing the applied conductive paste.

Further, inside the annular metallized layer 9 on the surface of the ceramic substrate 5, a thin-film conductor pattern 10 formed in a thickness of about 1 μm using a conductive metal composed of copper as a main component and other additional metal such as, for example, Cr/Cu, Ti/Cu, Cr/Cu/Cr, Ti/Cu/Cr, Cr/Cu/Au, or Ti/Cu/Au and a polyimide layer 11 having the thickness of about 10 μm are alternately superposed to produce a copper-polyimide multilayered wiring portion 12.

This multilayered wiring portion 12 is produced as follows.

First, the conductive metal composed mainly of copper as described above is deposited in the form of a thin layer by evaporating or sputtering on the ceramic substrate 5 inside the annular metallized layer 9. This thin film is etched by photolithography to remove unnecessary portions and produce a thin-film conductor pattern 10 as the first layer. In this case, the thin-film conductor pattern 10 as the first layer is so formed that the edge thereof will overlie the inner edges of the connection conductor patterns. As a result, it is electrically connected to the input and output conductor pads 6 through the medium of the connection conductor patterns 7. Then, a polyimide layer 11 is formed on thin-film conductor pattern 10 by depositing a polyimide resin solution by spin coating, drying the applied coat, and curing the coat. Then, the polyimide layer 11 is etched by photolithography to form therein via holes 13 for electrically connecting the conductor patterns 10 and impart a prescribed contour thereto.

By following the procedure described above, required numbers of the thin-film conductor patterns 10 and polyimide layers 11 are alternately superposed. On the thin-film conductor as the uppermost layer, a plurality of die pads 14 for supporting thereon such active devices as IC chips and such passive chip devices as resistors and capacitors and a plurality of outer lead bonding pads (OLB) 15 for electrically connecting the multilayered wiring portion 12 to the active devices mounted thereon through the medium of bonding wires are formed to complete copper-polyimide multilayered wiring portion 12.

On this multilayer substrate, the electronic devices are generally mounted as follows. By hermetically coating the electronic devices so mounted on the multilayer substrate, the electronic apparatus contemplated by this invention is completed.

To the die pads 14 mounted on the multilayered wiring portion 12, IC chips 16 and resistors (not shown) are severally joined with an adhesive agent 17 such as a conductive epoxy resin. These IC chips 16 and the corresponding OLB's 15 are electrically connected with bonding wires 18 such as, for example, Au wires or Al wires. On the annular metallized layer 9, a cap 19 made of a metal such as Kovar or Fe/Ni42 Alloy which has substantially the same thermal expansion coefficient as the ceramic is fixed with a eutectic solder 20 such as, for example the Sn/Pb 63/37 alloy. The air entrapped within the space enclosed with the metallic cap 19 and a accommodating therein the IC chips and other devices is displaced with an inactive gas 21 such as helium or nitrogen. Then, the cap 19 is sealed hermetically.

Further, on the input and output conductor pads 6, input and output leads such as the clip leads and input and output pins (not shown) are fixed as with a eutectic solder.

In the electronic apparatus of the present invention which is constructed as described above, since the multilayered wiring portion 12 on which the IC chips 16 and other electronic devices are mounted is formed of a polyimide resin possessing a very low dielectric constant as compared with the ceramic or crystallized glass, the floating capacity for distributed line patterns is small and the active devices such as the IC chips mounted on the multilayered wiring portion are enabled to operate at high speeds.

Since the empty space in which the IC chips 16 and other electronic devices are disposed is hermetically sealed with the metallic cap 19 and further since the peripheral portions exposed outside the metallic cap 19 are formed of the inorganic insulation layer 8 and the ceramic substrate 5 which are inorganic materials highly impervious to moisture, the interior of the metallic cap 19 never admits moisture and the electronic apparatus is perfectly free from the dangers of migration, corrosion of wires, and formation of dew.

In the present embodiment, since the annular metallized layer 9 and the input and output conductor pads 6 are both formed by the thick-film method using conductive metals which exhibit highly satisfactory wettability to the solder and diffuse at low speed in the solder, the metallic cap 19 and the input and output leads can be fixed strongly thereon with the solder 20.

Figure 4:
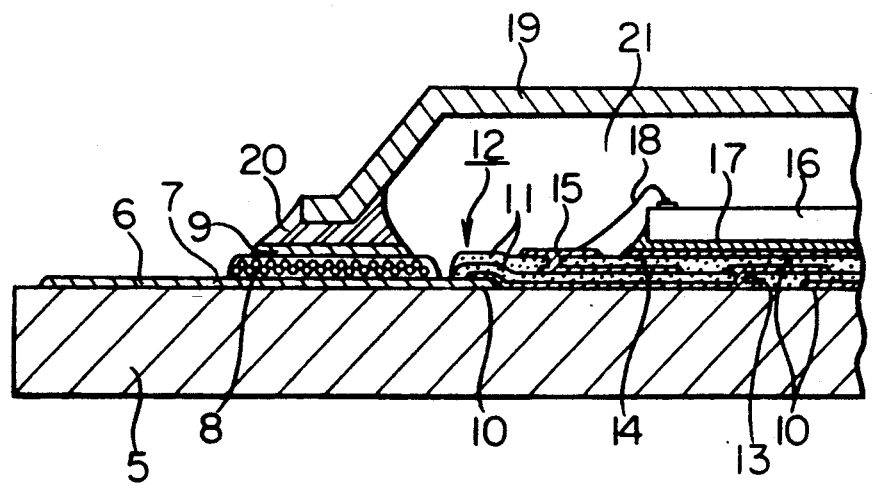
FIG. 4 is a partially magnified cross section illustrating one embodiment of the present invention using the multilayer substrate mentioned above.
Figure 5:
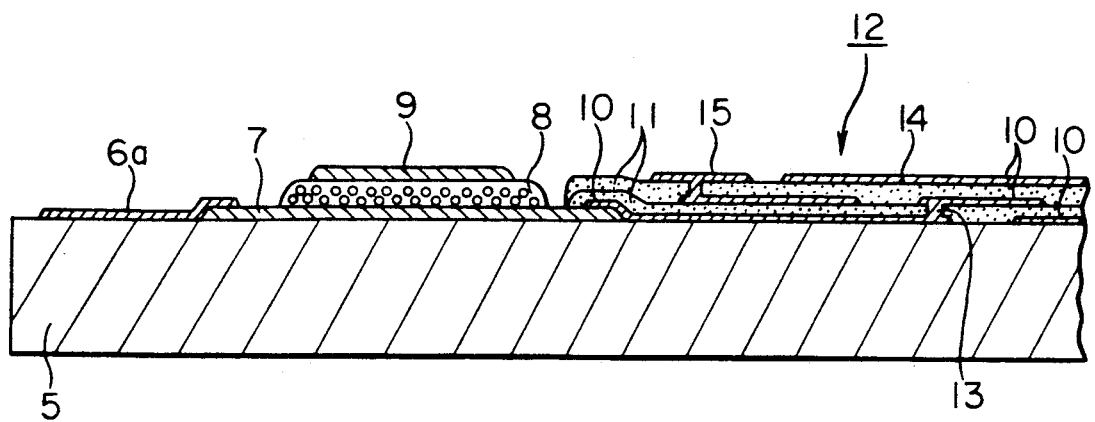
FIG. 5 is a partially magnified cross section illustrating another typical multilayer substrate to be used in embodying the present invention.
Figure 6:
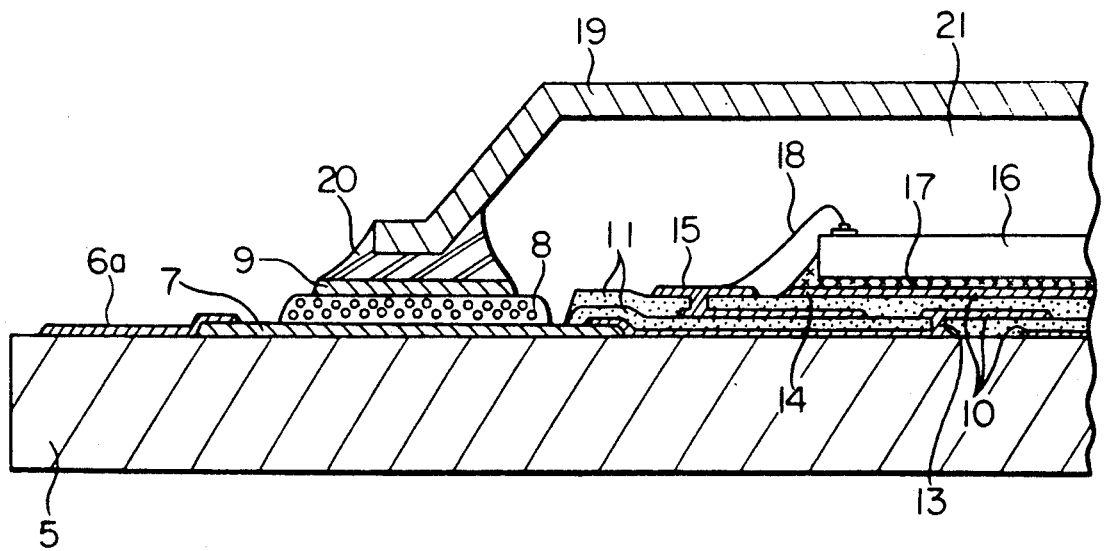
FIG. 6 is a partially magnified cross section illustrating another embodiment of the present invention using the multilayer substrate just mentioned.

FIG. 5 is a partially magnified cross section of another typical multilayer substrate to be used in embodying the present invention and FIG. 6 is a partially magnified cross section of another embodiment of this invention using this distribution substrate. This embodiment is identical in construction with the embodiment illustrated in FIGS. 2 through 4, excepting the input and output conductor pads 6 are formed by the thin-film method using a conductive metal composed of copper as a main component and other additional metal such as, for example, Cr/Cu, Ti/Cu, Cr/Cu/Cr, Ti/Cu/Cr, Cr/Cu/Au, or Ti/Cu/Au instead of the thick-film method. The component parts of this embodiment which have equals in the previous embodiment illustrated in FIGS. through 4, therefore, will be denoted by equal reference numerals and will be omitted from the following description of the present embodiment. In the present embodiment, the input and output conductor pads 6a are formed on the peripheral portion of the ceramic substrate 5 by the thin-film method using the aforementioned two-component or three-component conductive metal having copper as a main component in such a manner that part of the formed pads will float up on the connection conductor patterns 7.

The input and output conductor pads 6a are formed at the same time that the plurality of die pads 14 and the plurality of outer lead bonding pads (OLB) 15 are formed on the uppermost layer of the multilayered wiring portion 12.

In the present embodiment, since the input and output conductor pads 6a are formed of a thin film of the two-component or three-component conductive metal having copper as a main component and excelling in solderability, the input and output leads or the input and output pins can be soldered with ample strength.

Figure 7:
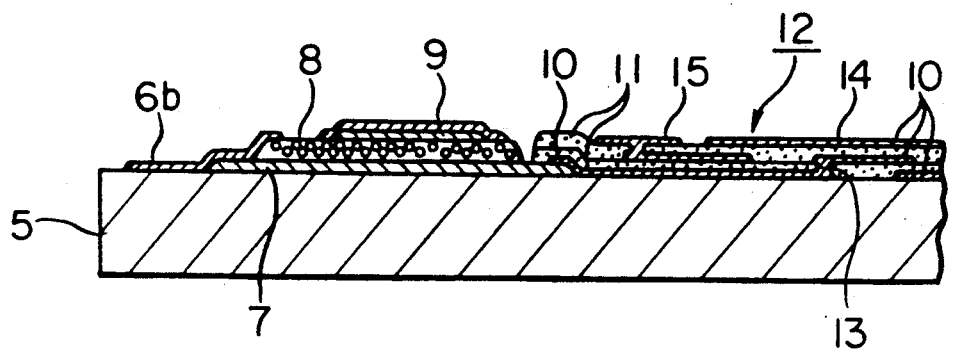
FIG. 7 is a partially magnified cross section illustrating yet another typical multilayer substrate to be used in embodying the present invention.
Figure 8:
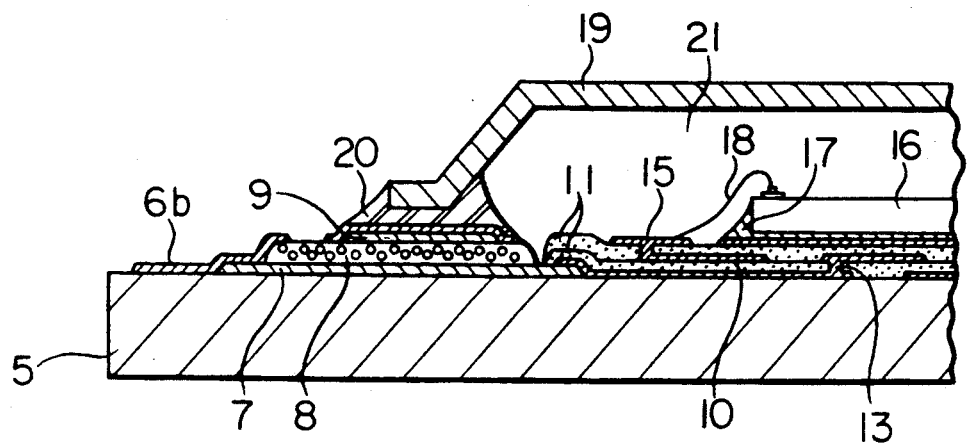
FIG. 8 is a partially magnified cross section illustrating yet another embodiment of the present invention using the mutilayer substrate mentioned above.

FIG. 7 is a partial cross section of yet another typical multilayer substrate to be used in this invention and FIG. 8 is a partial cross section illustrating yet another embodiment of this invention using the distribution substrate just mentioned. The present embodiment is identical in construction with the embodiment illustrated in FIGS. 2 through 4, excepting the input and output conductor pads 6b are formed of a thin film of the two-component or three-component conductive metal having copper as a main component and excelling in solderability and a thin film of the two-component or three-component conductive metal having copper as a main component and excelling in solderability is formed on the metallized layer 9. The component parts of this embodiment which have equals in the embodiment illustrated in FIGS. 2 through 4, therefore, will be denoted by equal reference numerals and will be omitted from the following description of the present embodiment.

In this embodiment, the input and output conductor pads 6b are formed by the thin-film method in such a manner as to extend from the edge of the ceramic substrate 5 to the inorganic insulation layer 8 astride the connection conductor patterns 7. Further in this embodiment, the annular metallized layer 9 formed by the thick-film method which is excellent in the fine pattern property and the multi-layer property and deficient in the property of union with solder is perfectly coated with a thin film using a conductive metal having as its main component copper, a highly solderable substance. As compared with the embodiment illustrated in FIG. 5, therefore, the present embodiment can afford an electronic apparatus having a metallic cap 19 fixed therein with great strength.

Figure 9:
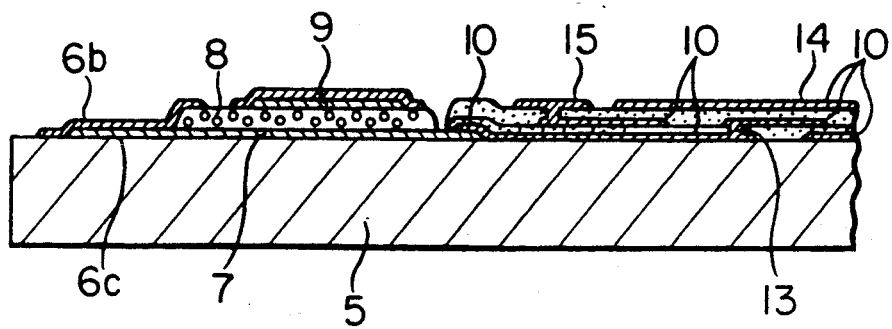
FIG. 9 is a partial cross section illustrating still another multilayer substrate to be used in embodying the present invention.

FIG. 6 and FIG. 8 represent cases in which the input and output conductor pads 6a and 6b are formed solely of a thin film using the two-component or three-component conductive metal having copper as a main component. Optionally, a plurality of input and output conductor pads 6c may be formed adjacently to the peripheral portion of the ceramic substrate 5 by the thick-film method using an Au paste, for example, in such a manner as to contact the connection conductor patterns 7 electrically and input and output conductor pads 6b one size larger than the input and output conductor pads 6c may be formed on the input and output conductor pads 6c by the thin-film method using a conductive metal having copper as a main component as illustrated in FIG. 9.

In the electronic apparatus using the multilayer substrate of the foregoing description, since the input and output conductor pads 6b which are formed of a thin film are fixed on the ceramic substrate 5 through the medium of the input and output conductor pads 6c formed of a thick-film conductor excelling in conductivity and abounding with adhesive strength to the ceramic substrate, the adhesive strength relative to the ceramic substrate and the soldering strength relative to the metallic cap are both improved.

What is claimed is:

1. An electronic apparatus, comprising:
   a ceramic substrate having a substantially planar main surface extending without functional surface irregularities to the periphery thereof,
   a multilayered wiring portion disposed at a distance from the periphery of the main surface of said ceramic substrate and including alternately repeating conductor patterns each having a thickness in the range of about 3 to 5 $\mu$m and formed by a thin film method using a conductive metal and a polyimide layer having a thickness of about 10 $\mu$m,
   electronic devices mounted on said multilayered wiring portion and electrically connected to the conductor patterns of said multilayered wiring portion,
   input and output conductor pads having a thickness in the range of about 1 to 20 $\mu$m and located on the periphery of the main surface of said ceramic substrate,
   connection conductor patterns having a thickness in the range of about 1 to 20 $\mu$m and extending on the main surface of said ceramic substrate between said input and output conductor pads and the conductor patterns of said multilayered wiring portion,
   an inorganic insulation layer having a thickness in the range of about 10 to 40 $\mu$m and extending on the main surface of said ceramic substrate over at least part of said connection conductor patterns as a closed annulus around said multilayered wiring portion, a metallized layer closed annularly on said inorganic insulation layer and formed by a thick-film method using a conductive composition selected from the group consisting of Au paste, Cu paste, Ag-Pt paste, Au-Pt paste, and Ag-Pd paste, and a mositureproof cap having an edge hermetically fixed by soldering on said metallized layer.

2. The apparatus of claim 1, wherein said connection conductor patterns are the patterns formed by a thick-film method using conductive composition, and said inorganic insulation layer is the layer formed by a similar method.

3. The apparatus of claim 1, further comprising a conductive metal pattern formed annularly on said metalized layer by the thin-film method using a conductive metal so as to cover said metallized layer.

4. The apparatus of claim 3, wherein said conductive metal is selected from the group consisting of Cr/Cu, Ti/Cu, Ti, Cu/Cr, Cr/Cu/Au, and Ti/Cu/Au.

5. The apparatus of any of claims 1, 2, 3, and 4, wherein said conductor patterns of said multilayered wiring portion are formed by photolithographically etching a thin film formed by evaporating or sputtering a metal selected from the group consisting of Cr/Cu, Ti/Cu/Cr, Cr/Cu/Au, and Ti/Cu/Au.

6. The apparatus of any of claims 1, 2, 3, and 4, wherein said polyimide layer of said multilayered wiring portion is formed by photolithographically etching a thin film formed by spin coating a polyimide resin.

7. The apparatus of any of claims 1, 2, 3, 4 wherein said polyimide is a photosensitive polyimide.

8. The apparatus of any of claims 1, 2, 3, and 4, wherein said conductor patterns forming said multilayered wiring portion include a lowermost layer having terminal portions superposed on and electrically connected to the inner edges of said connection conductor patterns.

9. The apparatus of any of claim 1, 2, 3, and 4, wherein said ceramic substrate is an alumina substrate.

10. The apparatus of any of claims 1, 2, 3, and 4, wherein said annular inorganic insulation layer is formed by printing crystalized glass paste, and drying and firing an applied layer of said crystallized glass paste.

11. The apparatus of any of claims 1, 2, 3, and 4, wherein said moistureproof cap is made of Kovar or Fe/Ni42 alloy.

* * * * *

UNITED STATES PATENT AND TRADEMARK OFFICE
CERTIFICATE OF CORRECTION

PATENT NO. : 5,153,709
DATED : October 06, 1992
INVENTOR(S) : Yoshitaka FUKUOKA

It is certified that error appears in the above-indentified patent and that said Letters Patent is hereby corrected as shown below:

Claim 1, column 9, line 8, change "mositureproof" to --moistureproof--.

Claim 3, column 9, line 17, change "alized" to --allized--.

Claim 4, column 9, line 21, change "Ti, Cu/Cr" to --Ti/Cu/Cr--.

Claim 5, column 10, line 2, before "Ti/Cu/Cr" insert --Ti/Cu,--.

Claim 7, column 10, line 7, change "4" to --and 4,--.

Claim 9, column 11, line 15, change "claim" to --claims--.

UNITED STATES PATENT AND TRADEMARK OFFICE
CERTIFICATE OF CORRECTION

PATENT NO. : 5,153,709
DATED : October 6, 1992
INVENTOR(S) : Yoshitaka Fukuoka

It is certified that error appears in the above-indentified patent and that said Letters Patent is hereby corrected as shown below:

Claim 10, column 11, line 20, change "crystalized" to --crystallized--

Signed and Sealed this

Fifteenth Day of March, 1994

Attest:

BRUCE LEHMAN

*Attesting Officer*  *Commissioner of Patents and Trademarks*